(12) United States Patent
Ayotte et al.

(10) Patent No.: US 7,839,002 B2
(45) Date of Patent: Nov. 23, 2010

(54) PARTIALLY UNDERFILLED SOLDER GRID ARRAYS

(75) Inventors: Stephen Peter Ayotte, Bristol, VT (US); Christina Marie Pepi, Underhill, VT (US); Timothy M. Sullivan, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 246 days.

(21) Appl. No.: 12/103,256

(22) Filed: Apr. 15, 2008

(65) Prior Publication Data
US 2009/0256268 A1 Oct. 15, 2009

(51) Int. Cl.
*H01L 23/48* (2006.01)
(52) U.S. Cl. .......... 257/784; 257/781; 257/780; 257/778; 257/E23.021
(58) Field of Classification Search ......... 257/778–786, 257/712, 738, 774; 438/108–111, 122–124, 438/612–624
See application file for complete search history.

(56) References Cited

U.S. PATENT DOCUMENTS

| | | | |
|---|---|---|---|
| 6,779,783 B2* | 8/2004 | Kung et al. | 257/780 |
| 6,906,425 B2 | 6/2005 | Stewart et al. | |
| 2002/0050407 A1* | 5/2002 | Sohn et al. | 174/262 |
| 2005/0023704 A1* | 2/2005 | Lin et al. | 257/781 |
| 2009/0057901 A1* | 3/2009 | Lin et al. | 257/738 |
| 2010/0007019 A1* | 1/2010 | Pendse | 257/737 |

* cited by examiner

*Primary Examiner*—Dung A. Le
(74) *Attorney, Agent, or Firm*—Schmeiser, Olsen & Watts; Anthony J. Canale

(57) ABSTRACT

An electronic device. The device including a module having opposite top surface and bottom surfaces; a first set of pads on the top surface of the module and a second set of pads on the bottom surface of the module substrate, wires within the module electrically connecting the first set of pads to the second set of pads; a set of solder interconnects in electrical and physical contact with a the second set of module pads; and a dielectric underfill layer formed on the bottom surface of the module, the underfill layer filling the space between lower regions of the solder interconnects of the set of solder interconnects, upper regions of the solder interconnects of the set of solder interconnects extending past a top surface of the underfill layer.

8 Claims, 2 Drawing Sheets

US 7,839,002 B2

PARTIALLY UNDERFILLED SOLDER GRID ARRAYS

FIELD OF THE INVENTION

The present invention relates to the field of integrated circuit packaging; more specifically, it relates to structures and methods of mounting integrated circuit modules to circuit boards.

BACKGROUND OF THE INVENTION

The industry trend to move from lead containing interconnects between integrated circuit modules and printed circuit boards and cards to low-lead and lead-free interconnects has introduced some unique challenges. One is that the strength of low-lead and lead-free interconnect is significantly less than that of high-lead interconnects resulting in mechanically weak interconnections. A second is low-lead and lead-free interconnects can become damaged and even fall off prior to card attachment. A third is rework is difficult as some interconnects may be lost during the dis-attach process. Accordingly, there exists a need in the art to overcome the deficiencies and limitations described hereinabove.

SUMMARY OF THE INVENTION

A first aspect of the present invention is an electronic device, comprising: a module substrate having a top surface and an opposite bottom surface; a first set of pads on the top surface of the module substrate and a second set of pads on the bottom surface of the module substrate, wires within the module substrate electrically connecting pads of the first set of pads to corresponding pads of the second set of pads; a set of module solder interconnects, each solder interconnect of the set of module solder interconnects in electrical and physical contact with a corresponding pad of the second set of module pads; and a dielectric underfill layer formed on the bottom surface of the module substrate, the underfill layer in contact with regions of pads of the second set of pads not covered by solder interconnects of the set of solder interconnects and in contact with lower regions of the solder interconnects of the set of module solder interconnects, the underfill layer filling the space between the lower regions of solder interconnects of the set of solder interconnects, upper regions of solder interconnects of the set of solder interconnects extending past a top surface of the underfill layer.

A second aspect of the present invention is a method of forming an electronic device, comprising: providing a module comprising: a module substrate having a top surface and an opposite bottom surface; a first set of pads top surface of the module substrate and a second set of pads on the bottom surface of the module substrate, wires within the module substrate electrically connecting pads of the first set of pads to corresponding pads of the second set of pads; and a set of module solder interconnects, each solder interconnect of the set of module solder interconnects in electrical and physical contact with a corresponding pad of the second set of module pads; and forming a dielectric underfill layer on the bottom surface of the module substrate, the underfill layer in contact with regions of pads of the second set of pads not covered by solder interconnects of the set of solder interconnects and lower regions of the solder interconnects of the set of module solder interconnects, the underfill layer filling the space between the lower regions of the pads of the set of module pads, upper regions of the pads of the set of module pads extending past a top surface of the underfill layer.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

An integrated circuit module is first level packaging element intermediate between an integrated circuit chip and second level packaging element, examples of second level packages include but are not limited to a printed circuit boards and printed circuit cards. A printed circuit board includes one or more wiring levels embedded in and/or on one or more surfaces of an organic based dielectric material (which may include non-organic materials like fiberglass). Integrated circuit modules are physically mounted and electrically connected to printed circuit boards by metallurgical interconnects. Examples of module types include ceramic modules (wires on or embedded in a ceramic substrate), multilayer ceramic modules (multiple levels of wires on and/or embedded in multiple layers of ceramic material) and printed circuit boards. A lead-free interconnect is defined as metallurgical interconnect containing none to less than about 0.01% lead. A low lead interconnect is defined as a metallurgical interconnect containing less than about 5% lead.

Figure 1:
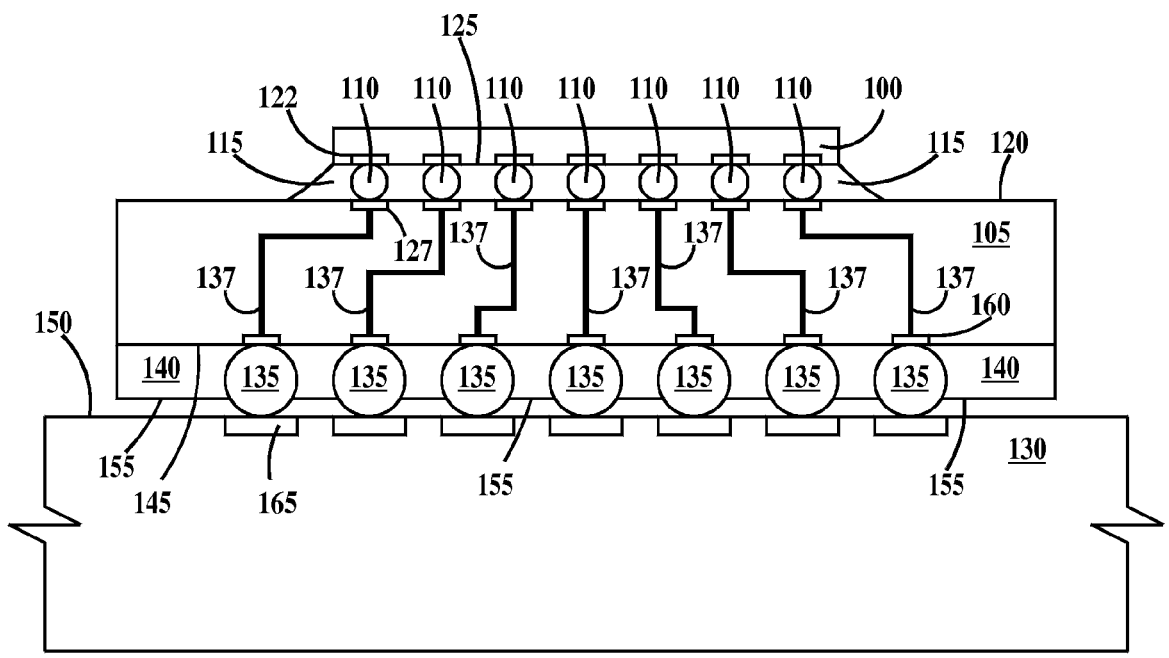
FIG. 1 a cross-sectional view through an integrated circuit chip/module/circuit board assembly according to embodiments of the present invention.

FIG. 1 a cross-sectional view through an integrated circuit chip/module/circuit board assembly according to embodiments of the present invention. In FIG. 1, an integrated circuit chip 100 is physically and electrically connected to a module 105 by solder bumps 110. An optional dielectric underfill material 115 fills completely the space between a top surface 120 of module 105 and a top surface 125 of chip 100. Surface 125 is the top surface of chip 100 because the chip has been flipped 180° from the orientation of the chip when in wafer form during fabrication of the various semiconductor devices of chip 100. Solder bumps 110 are also known as controlled collapse chip connections (C4s). In the industry, this type of chip to module attachment is often called flip-chip attach. In one example, underfill material 115 is an epoxy. In one example, underfill material 115 is a silica filled epoxy. Solder bumps 110 are formed on chip 100 before chip 100 is attached to module 120. The process of attaching chip 100 to module 105 includes reflowing (e.g., heating) solder bumps 110 at a high enough temperature so the solder bumps melt and reflow to form solder connections between pads 122 on top surface 125 of chip 100 and pads 127 on the top module. After reflow, underfill material 115 is injected into the space between chip 100 and module 105.

A printed circuit board 130 is physically and electrically connected to module 105 by solder balls 135 (also known as solder balls) in a interconnection technology known as ball grid array (BGA). Solder balls 135 are electrically connected to solder bumps 110 by wires 137 in module 105. A dielectric underfill layer is 140 formed on a bottom surface 145 of module 105 partially fills the spaces between solder balls 135. Regions of solder balls 135 extend beyond a top surface 155 of underfill layer 140. In one example, underfill layer 140 comprises a material selected from the group consisting of epoxy, silica filled epoxy, silicone, acrylic resin, poly vinyl chloride resin, a thermosetting resin and a thermoplastic. Underfill layer 140 may be formed, by flipping module 105 so bottom surface 145 is facing upward and applying the underfill material as a liquid and then curing (e.g., thermally or using ultraviolet light) the liquid into a solid or semi-solid state. Underfill layer 140 may be formed before or after attaching chip 100 to module 105. Underfill layer 140 is formed before attaching module 105 to board 130.

Figure 2:
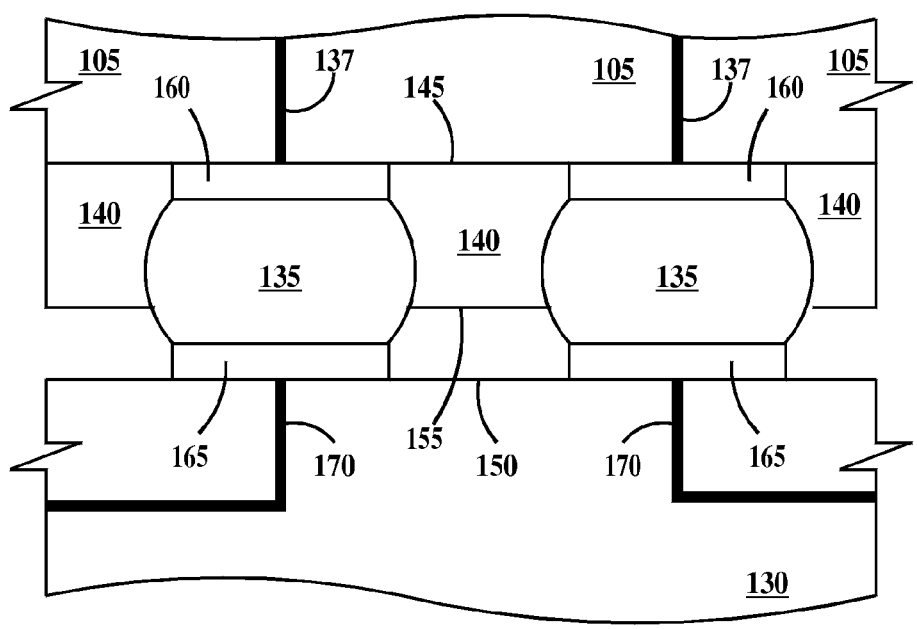
FIG. 2 is a more detailed and larger cross-sectional view through a portion of the an integrated circuit chip/module/circuit board assembly of FIG. 1.

FIG. 2 is a more detailed and larger cross-sectional view through a portion of the an integrated circuit chip/module/circuit board assembly of FIG. 1. In FIG. 2, electrically conductive pads 160 on bottom surface 145 of module are connected to wires 137 and pads 165 on top surface 150 of board 130 are electrically connected to wires 170 of board 130. Alternatively, pads 165 may be integrally formed with wires formed on top surface 150 of module as is well known in the art. In one example solder balls 135 contain no lead. In one example solder balls 135 contain less than about 0.01% lead. In one example solder balls 135 contain less than about 5% lead.

The process of attaching module 105 to board 130 includes reflowing (e.g., heating) solder balls 135 at a high enough temperature so the solder balls melt and reflow to form solder connections between pads 160 and 165. After attaching module 105 to board 130, underfill layer 140 does not contact top surface 150 of board 130, but does contact bottom surface 145 of module 105, edges of pads 160 and regions of the sidewalls of solder balls 135. In one example, underfill 140 acts as a mechanical re-enforcement to prevent movement between solder balls 140 and bottom surface 145 of module 105. In one example, underfill 140 acts as an adhesive between solder balls 140 and bottom surface 145 of module 105.

Figure 3:
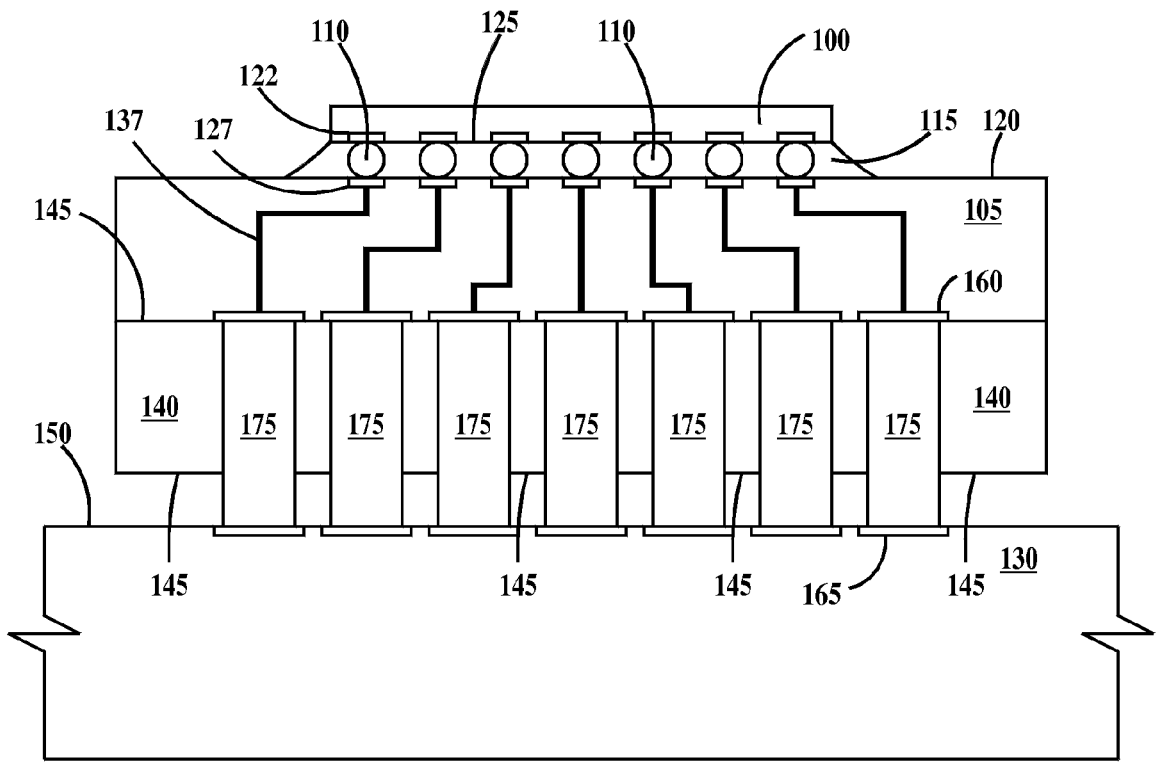
FIG. 3 is a cross-sectional view through an integrated circuit chip/module/circuit board assembly according to additional embodiments of the present invention.

FIG. 3 is a cross-sectional view through an integrated circuit chip/module/circuit board assembly according to additional embodiments of the present invention. FIG. 3 is similar to FIG. 1, except solder balls 135 of FIG. 1 are replaced by solder columns 175 in FIG. 3. Solder columns 175 are electrically connected to solder bumps 110 by wires 137 in module 105 Regions of solder columns 175 extend beyond top surface 155 of underfill layer 140. Solder columns 175 are cylindrical in shape. In one example solder columns 175 contain no lead. In one example solder columns 175 contain less than about 0.01% lead. In one example solder columns 175 contain less than about 5% lead.

Figure 4A:
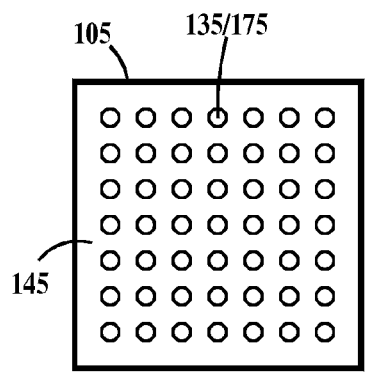
FIGS. 4A and 4B are views of the bottom side of integrated circuit modules illustrating two interconnect array patterns.
Figure 4B:
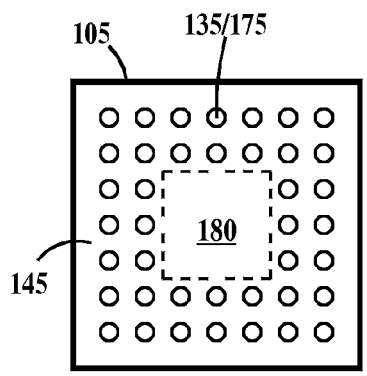

FIGS. 4A and 4B are views of the bottom side of integrated circuit modules illustrating two interconnect array patterns. In FIG. 4A, a two dimension array of solder bumps 135/solder columns 175 are arranged on bottom surface 145 of module 105. FIG. 4B is similar to FIG. 4A, except, the array of solder bumps 135/solder columns 175 has an interior 180 not having solder bumps 135/solder columns 175.

Thus the embodiments of the present invention provide a robust and strong interconnect structure for physically mounting and electrically connecting integrated circuit modules to printed circuit boards and cards.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the partial underfill method may be applied to high-lead and other interconnection metallurgies where extremely strong attachment to the module is required. Therefore, it is intended that the following claims cover all such modifications and changes as fall within the true spirit and scope of the invention.

What is claimed is:

1. An electronic device, comprising:
   a module substrate having a top surface and an opposite bottom surface;
   a first set of pads on said top surface of said module substrate and a second set of pads on said bottom surface of said module substrate, wires within said module substrate electrically connecting pads of said first set of pads to corresponding pads of said second set of pads;
   a set of module solder interconnects, each solder interconnect of said set of module solder interconnects in electrical and physical contact with a corresponding pad of said second set of module pads; and
   a dielectric underfill layer formed on said bottom surface of said module substrate, said underfill layer in contact with regions of pads of said second set of pads not covered by solder interconnects of said set of solder interconnects and in contact with lower regions of said solder interconnects of said set of module solder interconnects, said underfill layer filling the space between said lower regions of solder interconnects of said set of solder interconnects, upper regions of solder interconnects of said set of solder interconnects extending past a top surface of said underfill layer.

2. The device of claim 1, wherein said solder interconnects are solder balls or solder columns.

3. The device of claim 1, wherein said solder interconnects do not contain lead.

4. The device of claim 1, wherein said solder interconnects contain less than about 5% lead.

5. The device of claim 1, further including:
   an integrated circuit chip having a set of chip pads formed on a surface of said chip; and
   a set of solder bumps electrically and physically connecting pads of said set of chip pads to corresponding pads of said first set of pads.

6. The device of claim 5, further including:
   a dielectric underfill material filling the space between said surface of said chip and said top surface of said module substrate.

7. The device of claim 5, further including:
   a dielectric board having a set of board pads formed on a surface of said board, said solder interconnects electrically and physically connecting pads of said set of module pads to corresponding pads of said set of board pads.

8. The device of claim 1, wherein said underfill layer comprises a material selected from the group consisting of epoxy, silica filled epoxy, silicone, acrylic resin, poly vinyl chloride resin, a thermosetting resin and a thermoplastic.

* * * * *